United States Patent
Smith, Jr. et al.

(10) Patent No.: US 8,350,765 B2
(45) Date of Patent: Jan. 8, 2013

(54) RESONANT CAVITY INJECTION-BASED CALIBRATION OF A RADIANT ENERGY DEVICE

(75) Inventors: Jerry Rosson Smith, Jr., Springfield, VA (US); Thomas J. Miller, Pasadena, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 432 days.

(21) Appl. No.: 12/780,391

(22) Filed: May 14, 2010

(65) Prior Publication Data
US 2011/0279334 A1  Nov. 17, 2011

(51) Int. Cl.
*H01Q 1/02* (2006.01)
(52) U.S. Cl. .......... 343/703; 343/893
(58) Field of Classification Search .......... 343/703, 343/893
See application file for complete search history.

(56) References Cited

U.S. PATENT DOCUMENTS

| 6,447,160 | B1 | 9/2002 | Fraden | |
|---|---|---|---|---|
| 7,598,506 | B2 | 10/2009 | Wilcken et al. | |
| 7,610,816 | B2 * | 11/2009 | Okazaki | 73/861.14 |
| 8,085,156 | B2 * | 12/2011 | Schumacher et al. | 340/612 |
| 2002/0160717 | A1 * | 10/2002 | Persson et al. | 455/67.1 |
| 2008/0119421 | A1 * | 5/2008 | Tuszynski et al. | 514/34 |

\* cited by examiner

*Primary Examiner* — Hoanganh Le
(74) *Attorney, Agent, or Firm* — Howard Kaiser

(57) ABSTRACT

The present invention, as typically embodied, implements an energy source, a transmitting antenna, a receiving antenna, a resonant cavity, and an electricity meter (e.g., voltmeter, ammeter, or power meter) to calibrate an electronic device. Firstly, the receiving antenna is calibrated based on measurement of power that has been generated and transmitted in known quantity, propagated through air, and received by the receiving antenna. Secondly, the resonant cavity is connectively situated between the transmitting antenna and the receiving antenna; the resonant cavity is calibrated based on measurement of power that has been generated and transmitted in the same quantity, propagated through the resonant cavity, and received by the receiving antenna. Thirdly, an electronic device is substituted for the receiving antenna; the electronic device is calibrated based on measurement of power that has been generated and transmitted in the same quantity, propagated through the resonant cavity, and received by the electronic device.

16 Claims, 5 Drawing Sheets

RESONANT CAVITY INJECTION-BASED CALIBRATION OF A RADIANT ENERGY DEVICE

BACKGROUND OF THE INVENTION

The present invention relates to calibration, more particularly to methods and systems for calibrating optical (e.g., imaging) devices and other electronic devices involving or utilizing radiant energy such as propagated as electromagnetic waves.

"Passive" imaging devices receive naturally occurring electromagnetic signals that are emanated or reflected by objects. Passive imaging devices are distinguishable from "active" imaging devices, which transmit electromagnetic radiation (e.g., active radar devices transmit radio signals) in order to receive reflected electromagnetic signals (e.g., radio signals) that are informative of objects and their locations. Unlike active imaging devices, passive imaging devices do not transmit electromagnetic radiation.

Passive imaging devices generally operate in one of three regions of the electromagnetic spectrum, viz., the visual (optical) region, the infrared (IR) region, or the millimeter wave (MMW) region. In the electromagnetic spectrum, the IR region is characterized by longer wavelengths than is the visual region (visible spectrum), the IR region extending between the visual region and approximately one millimeter in wavelength. The millimeter wave region is characterized by longer wavelength than is the IR region, and is characterized by shorter wavelengths than is the "radar" (including microwaves and radio waves) region.

Real-world objects are considered to behave as "graybody" transmitters. The actual emission of a material is the "blackbody" value (the total radiation intensity according to the Stefan-Boltzmann law) multiplied by the material's "emissivity," which is particular to that material and normally depends on factors such as electromagnetic wavelength, temperature, and emission angle. Emissivity, a dimensionless quantity, is a measure of the ability of a material to radiate absorbed energy. A blackbody is a theoretical object characterized by both perfect (100%) absorption and perfect (100%) emission of radiation. A blackbody has an emissivity of one, while real-world objects have an emissivity of less than one. Emissivity thus represents the ratio of energy radiated by a material at a given temperature, to energy radiated by a blackbody at the same temperature.

Many current techniques for calibrating passive imaging devices, such as passive millimeter wave (PMMW) devices, involve "absolute" calibration. An absolute calibration approach requires absolute knowledge of a given material's radiometric properties. Absolute calibration can be advantageous in that the power radiance characterizing a test material can be known with exactitude. Nevertheless, absolute calibration necessitates a trusted calibration methodology for the wavelength of interest.

Alternative calibration techniques involve "relative" calibration (synonymously, "comparative" calibration), according to which the passive imaging device's (e.g., PMMW device's) output is measured relative to a given baseline body. Relative calibration often assumes this baseline body to be the "idealized" blackbody. The resultant calibration errors are thus due, at least in part, to the unknown deviation of the baseline body from the idealized blackbody.

SUMMARY OF THE INVENTION

In view of the foregoing, it is an object of the present invention to provide improved method, apparatus, and computer program product for calibrating electronic devices that implement radiant energy, such as for imaging purposes.

The present invention, as typically embodied, provides an absolute calibration methodology for PMMW devices and other imaging and non-imaging devices. The present invention is uniquely based on power injection in a resonant cavity. The present invention's absolute calibration of a radiant energy device (e.g., a PMMW device) features power injection into a high-emissivity resonant cavity to simulate a near-blackbody. As elaborated upon hereinbelow, according to typical inventive practice: (a) a receiving antenna is calibrated; then, (b) a resonant cavity is calibrated; then, (c) an electronic device of interest is calibrated.

The present invention's first stage, viz., calibration of the receiving antenna, includes measurement of a value of power transmitted through air and received by the receiving antenna. The power is characterized by an original value prior to being transmitted through air and received by the receiving antenna. The present invention's calibration of the receiving antenna further includes adjustment of the measured value of the power transmitted through air and received by the receiving antenna to correspond to the original value of the power.

The present invention's second stage, viz., calibration of the resonant cavity, includes measurement of a value of power transmitted through the resonant cavity and received by the receiving antenna, the receiving antenna having been calibrated in accordance with step (a). The power is characterized by the same original value prior to being transmitted through the resonant cavity and received by the receiving antenna. The present invention's calibration of the resonant cavity further includes adjustment of the measured value of the power transmitted through the resonant cavity and received by the receiving antenna (calibrated in accordance with step (a)) to equal the measured value, in accordance with step (a), of power transmitted through air and received by the receiving antenna.

The present invention's third stage, viz., calibration of the electronic device of interest, includes measurement of a value of power transmitted through the resonant cavity (calibrated in accordance with step (a)) and received by the electronic device. The power is characterized by the same original value prior to being transmitted through the resonant cavity and received by the electronic device. The present invention's calibration of the electronic device further includes adjustment of the measured value of power transmitted through the resonant cavity (calibrated in accordance with step (a)) and received by the electronic device to equal the measured value, in accordance with step (b), of power transmitted through the resonant cavity and received by the receiving antenna (calibrated in accordance with step (a)).

The present invention's determinations of the total power incident on the receiving device and on the electronic (e.g., PMMW) device benefit from the high degrees of accuracy associated with current active measurement instrumentation. In addition, the inventive methodology is valid for and applicable to: any electromagnetic wavelength regime; all of the Stokes vector polarization fields; any acoustic wavelength regime. The present invention can be practiced to calibrate not only electronic devices implementing electromagnetic energy, but also electronic devices implementing acoustic energy. In particular, inventive practice can be brought to bear on passive electromagnetic imaging devices as well as passive acoustic imaging devices.

Other objects, advantages and features of the present invention will become apparent from the following detailed description of the present invention when considered in conjunction with the accompanying drawings.

BRIEF DESCRIPTION OF THE DRAWINGS

The present invention will now be described, by way of example, with reference to the accompanying drawings, wherein.

DETAILED DESCRIPTION OF THE INVENTION

Figure 1:
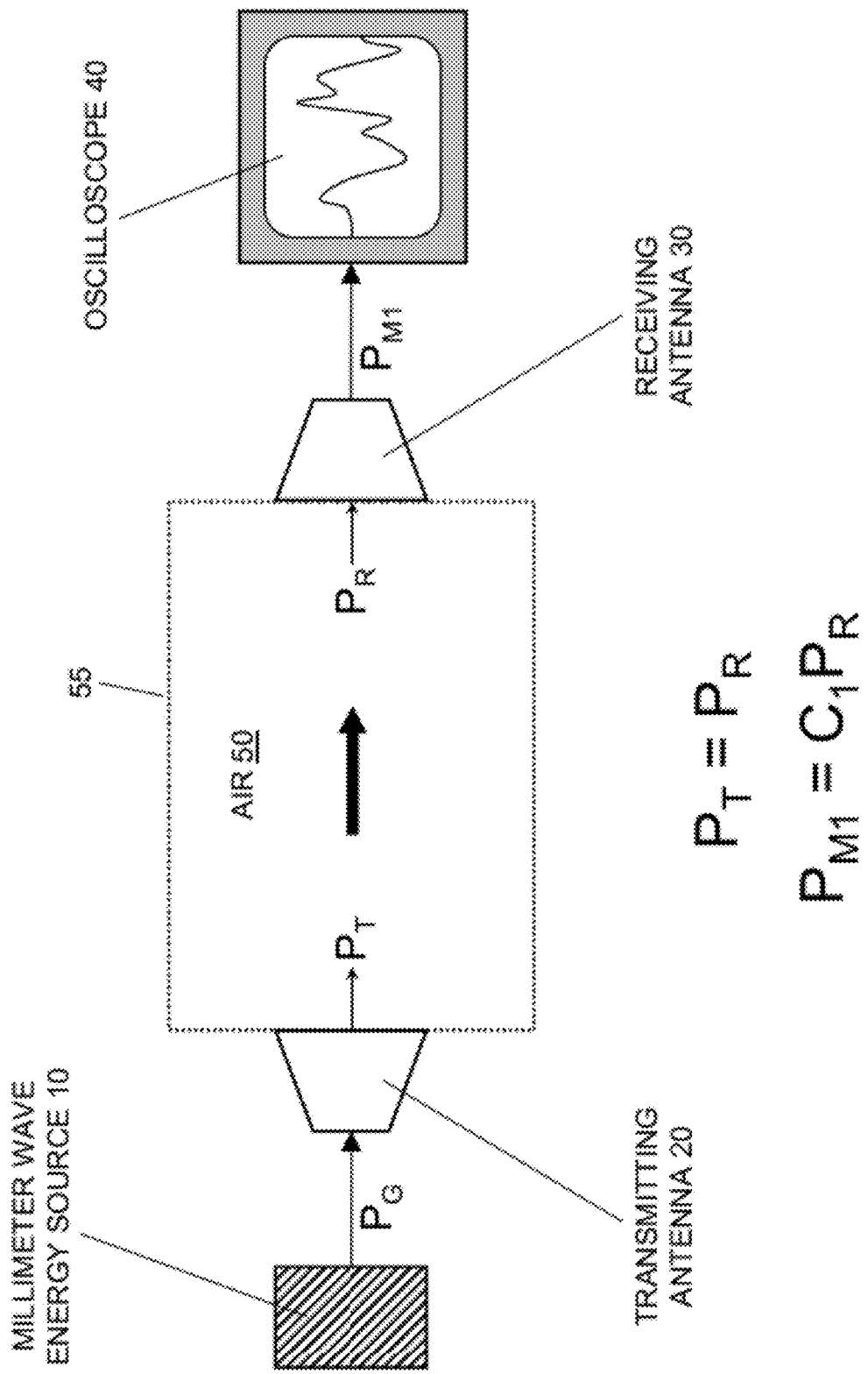
FIG. 1 is a schematic of the first stage of calibration in accordance with typical practice of the present invention.

Reference is now made to FIG. 1, which illustrates the first of three main calibrative stages according to typical practice of the present invention. Energy source 10 and transmitting antenna 20 are connected to each other, and receiving antenna 30 and oscilloscope 40 are connected to each other. An air 50 gap separates transmitting antenna 20 and receiving antenna 30.

Millimeter wave energy source 10 generates a known magnitude of radiant (electromagnetic) power $P_G$, which is transmitted via transmitting antenna 20 as radiant power $P_T$. The transmitted radiant power $P_T$ is propagated through the ambient air 50 filling the space separating transmitting antenna 20 and receiving antenna 30. In order to ensure that all of the radiant energy from transmitting antenna 20 reaches receiving antenna 30, techniques can be effected such as closely (e.g., proximately or abuttingly) situating transmitting antenna 20 and receiving antenna 30, or implementing a propagation guidance device (e.g., air-filled waveguide 55 placed between transmitting antenna 20 and receiving antenna 30, as represented in FIG. 1). The radiant power received by receiving antenna 30, radiant power $P_R$, is measured as a quantity of electrical power (e.g., electrical voltage, electrical current, or electrical power, where electrical power equals electrical voltage multiplied by electrical current) using an electricity meter (e.g., voltmeter, ammeter, electrical power meter, or multimeter) such as oscilloscope 40 (a type of voltmeter). As shown in FIG. 1, receiving antenna 30 is connected to oscilloscope 40.

The amount of generated, antenna-transmitted, air-conveyed, antenna-received, measured first-stage power, $P_{M1}$, is compared to the amount of generated, antenna-transmitted power, $P_T$. A first calibration factor, $C_1$, is calculated in accordance with the following relationships:

$$P_G = P_T = P_R \quad (1.1)$$

$$P_{M1} = C_1 P_R \quad (1.2)$$

$P_G$ is the power that is generated by power source 10. $P_T$ is the power that is generated by power source 10 and then transmitted by transmitting antenna 20. $P_R$ is the power that is generated by power source 10, then transmitted by transmitting antenna 20, then conveyed through air 50, and then received by receiving antenna 30. $P_{M1}$ is the power that is generated by MMW power source 10, then transmitted by transmitting antenna 20, then conveyed through air 50, then received by receiving antenna 30, and then measured by oscilloscope 40. Oscilloscope 40 measures a voltage associated with a signal emitted by receiving antenna 30.

According to typical inventive practice, it is sufficiently accurate to assume that transmitting antenna 20 transmits exactly the generated radiant power, and that the air 50 between transmitting antenna 20 and receiving antenna 30 is "free space" in the sense of substantially unimpeded movement of energy through air 50; hence, equation (1.1) obtains.

Figure 2:
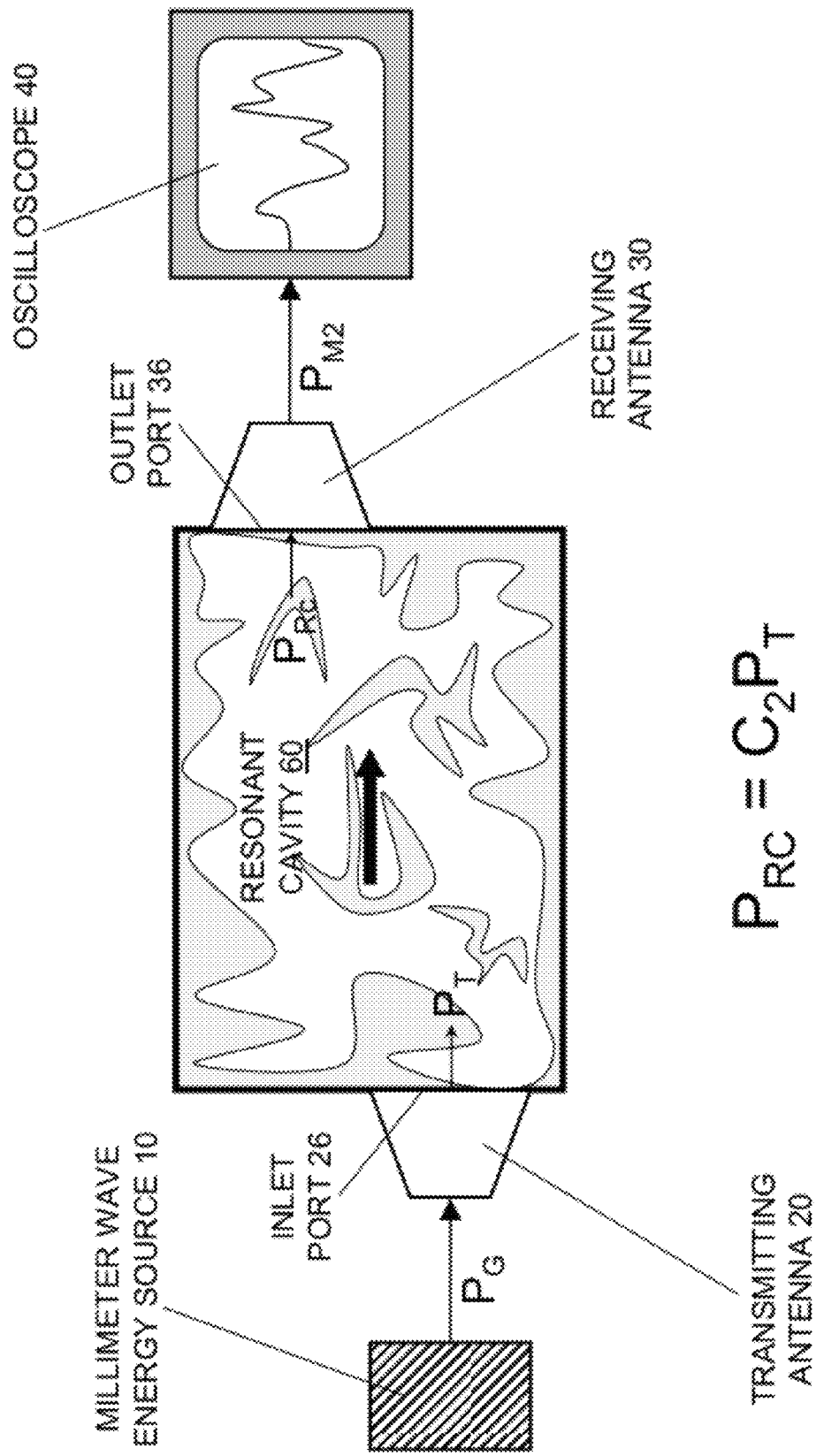
FIG. 2 is a schematic of the second stage of calibration in accordance with typical practice of the present invention.

With reference to FIG. 2, the second-stage apparatus setup is basically the same as the first-stage apparatus setup, except that in this, the second stage, resonant cavity 60 is substituted for air 50. Resonant cavity 60 is introduced between transmitting antenna 20 and receiving antenna 30. Transmitted antenna 20 and receiving antenna 30 are connected to resonant cavity 60 at its inlet port 26 and its outlet port 36, respectively. Receiving antenna 30 remains connected to oscilloscope 40, as in the first stage.

Energy source 10 generates the same magnitude of radiant power $P_G$ in the second stage as in the first stage. According to the second stage, resonant cavity 60 entirely replaces air 50 as the medium through which transmitted radiant power $P_T$ is conveyed in traveling from transmitting antenna 20 to receiving antenna 30. Radiant power $P_G$ is transmitted via transmitting antenna 20 as transmitted power $P_T$, which is propagated through resonant cavity 60 and received by receiving antenna 30 as radiant power $P_{RC}$.

The amount of generated, antenna-transmitted, cavity-conveyed, antenna-received, measured second-stage power, $P_{M2}$, is compared to the amount of generated, antenna-transmitted power, $P_T$. This comparison is tantamount to comparing measured second-stage power $P_{M2}$ to measured first-stage power $P_{M1}$, since measured first-stage power $P_{M1}$ has previously been compared, in the first stage, to antenna-transmitted power $P_T$. A second calibration factor, $C_2$, is calculated in accordance with the following relationships:

$$P_{RC} = C_2 P_T \quad (2.1)$$

$$P_{M2} = C_1 P_{RC} = C_1 C_2 P_T \quad (2.2)$$

$P_{RC}$ is the power that is generated by power source 10, then transmitted by transmitting antenna 20, then conveyed through resonant cavity 60, and then received by receiving antenna 30. $P_{M2}$ is the power that is generated by MMW power source 10, then transmitted by transmitting antenna 20, then conveyed through resonant cavity 60, then received by receiving antenna 30, and then measured by oscilloscope 40.

Figure 3:
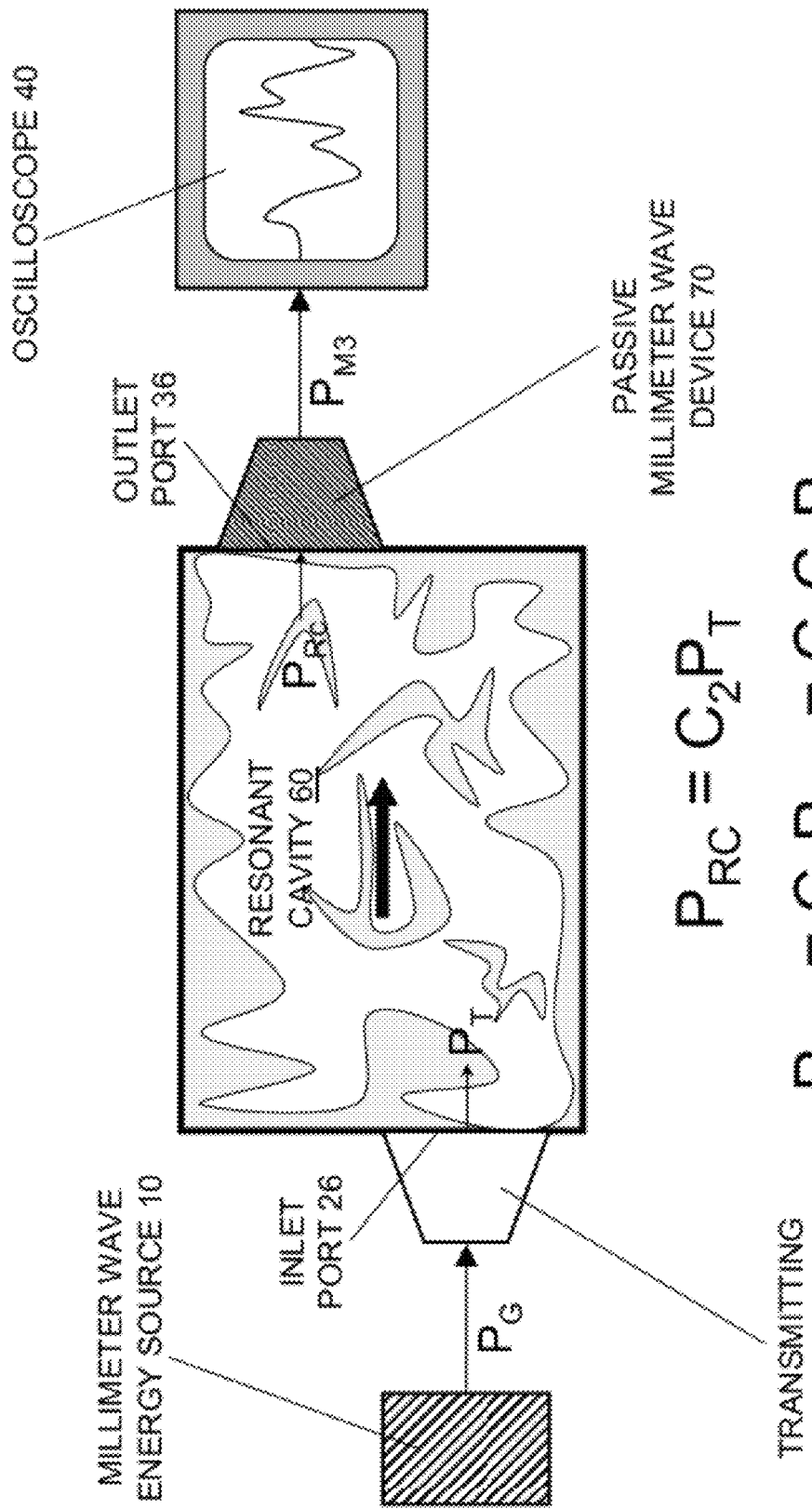
FIG. 3 is a schematic of the third stage of calibration in accordance with typical practice of the present invention.

Now referring to FIG. 3, the third-stage apparatus setup is basically the same as the second-stage apparatus setup, except that in this, the third stage, the electronic device of interest 70 is substituted for receiving antenna 30. Receiving antenna 30 is replaced with passive millimeter wave (PMMW) device 70. Transmitted antenna 20 and receiving antenna 30 remain connected to resonant cavity 60 at its inlet port 26 and its outlet port 36, respectively.

Energy source 10 generates the same magnitude of radiant power $P_G$ in the third stage as in the first stage and the second stage. As in the second stage, in the third stage transmitted radiant power $P_T$ is conveyed through resonant cavity 60. Transmitted radiant power $P_T$ travels from transmitting antenna 20, through resonant cavity 60, to PMMW device 70. Radiant power $P_G$ is transmitted via transmitting antenna 20 as transmitted power $P_T$, which is propagated through resonant cavity 60 and received by PMMW device 70 as radiant power $P_{RC}$.

The amount of generated, antenna-transmitted, cavity-conveyed, device-received, measured third-stage power, $P_{M3}$, is compared to the amount of generated, antenna-transmitted power, $P_T$. This comparison is tantamount to comparing measured third-stage power $P_{M3}$ to measured second-stage power $P_{M2}$, since measured second-stage power $P_{M2}$ has previously been compared, in the second stage, to antenna-transmitted power $P_T$. A third calibration factor, $C_3$, is calculated in accordance with the following relationships:

$$P_{RC} = C_2 P_T \tag{3.1}$$

$$P_{M3} = C_3 P_{RC} = C_3 C_2 P_T \tag{3.2}$$

$$C_3 = P_{M3}/P_{RC} = P_{M3}/C_2 P_T \tag{3.3}$$

PMMW device 60 receives the same radiant power $P_{RC}$ in the third stage that receiving antenna 30 receives in the second stage. In other words, $P_{RC}$ is the power that is generated by power source 10, then transmitted by transmitting antenna 20, then conveyed through resonant cavity 60, and then received by either receiving antenna 30 (in the second stage) or PMMW device 70 (in the third stage). $P_{M3}$ is the power that is generated by MMW power source 10, then transmitted by transmitting antenna 20, then conveyed through resonance cavity 60, then received by PMMW device 70, and then measured by oscilloscope 40.

Energy source 10 is a known power source (e.g., a known temperature source) and has connected to it a known transmitting antenna 20. According to some inventive embodiments the energy source is a variable power source/supply, such as a variable MMW power source/supply for MMW applications. In all three stages, the same electronic/electrical settings are used for energy source 10, transmitting antenna 20, and oscilloscope 40. Typical inventive embodiments implement a transmitting antenna 20 and a receiving antenna 30 that are the same type of antenna. The same settings are used for receiving antenna 30 in the first and second stages.

In the second and third stages, the same resonant cavity 60 is interposed between transmitting antenna 20 and receiving antenna 30, and hence the distance is the same between transmitting antenna 20 and receiving antenna 30. The distance between transmitting antenna 20 and receiving antenna 30 (separated by air 50) in the first stage need not equal the distance between transmitting antenna 20 and receiving antenna 30 (separated by resonant cavity 60) in the second and third stages; according to frequent practice, the first-stage distance between transmitting antenna 20 and receiving antenna 30 is considerably shorter than the second-and-third-stage distance; according to some inventive embodiments, in the first stage transmitting antenna 20 and receiving antenna 30 are closely spaced apart or practically next to each other, with a narrow air 50 clearance therebetween.

It will be understood by the ordinarily skilled artisan who reads the instant disclosure that the device referred to herein as "electrical meter" (of which oscilloscope 40 is an example) in context of inventive practice broadly refers to any electronic device (e.g., measuring scope, oscilloscope, voltmeter, ammeter, power meter) that measures and/or records electrical signals (e.g., in the form of voltage or current or power), and may include electronic components such as power amplifier, analog-to-digital converter, computer (e.g., processor and memory), display, etc.

In the first stage, air 50 is the electronic system to which signals are input and from which signals are output; that is, input signal $P_T$ goes into the electronic system (air 50), and output signal $P_R$ comes out of the electronic system (air 50). In each of the second and third stages, resonant cavity 60 (instead of air 50) is the electronic system to which signals are input and from which signals are output; that is, input signal $P_T$ goes into the electronic system (resonant cavity 60), and output signal $P_{RC}$ comes out of the electronic system (resonant cavity 60).

The first stage, illustrated in FIG. 1, serves to "baseline" the transmitted power; in essence, the receiver is calibrated to the transmitter. Transmitting antenna 20 is attached to a given millimeter wave energy source 10 with known power radiance. Transmitting antenna 20 is calibrated with a similar receiving antenna 30, which is attached to a measuring scope (e.g., oscilloscope) 40. In a sense, the overall transmit-receive system is calibrated; that is, receiving antenna 30 together with oscilloscope 40 is calibrated to transmitting antenna 20 together with power source 10.

In the first stage, energy source 10 is "energized," and the power from energy source 10 and transmitting antenna 20 is "measured" in the sense of electrical conversion by receiving antenna 30, which essentially converts incident power on receiving antenna 30 into output voltage supplied to oscilloscope 40. Calibration factor $C_1$ is the calibration factor that is associated with the receiving antenna 30, and that converts the radiant power incident onto the receiving antenna 30 into the electrical signal output by the receiving antenna 30 and measured by the oscilloscope 40.

The first stage thus determines a power-to-voltage conversion; the known amount of power from energy source 10, and that reaches oscilloscope 40 via transmitting antenna 20, air 50, and receiving antenna 30, equates to a measured amount of voltage going into oscilloscope 40. The first-stage calibration permits determination, in the second stage, of the amount of radiation that is absorbed and re-radiated by resonant cavity 60, i.e., the emissivity of resonant cavity 60. Furthermore, the first-stage calibration permits determination, in the third stage, of the degree of deviation of the electronic device 70 from the standard established in the second stage by the receiving antenna 30.

In the second stage, illustrated in FIG. 2, resonant cavity 60 is situated between transmitting antenna 20 and receiving antenna 30. The energy source 10—transmitting antenna 20 unit is attached to the inlet (input) port 26 of resonant cavity 60. The oscilloscope 40—receiving antenna 30 unit is attached to the outlet (output) port 36 of resonant cavity 60. The entire system is operated until the steady state has been achieved. The resulting measurement on oscilloscope 40 is the absolute power incident on outlet port 36 of resonant cavity 60.

Second-stage determination of the level of power incident on receiving antenna 30 is based on calibration factor $C_2$, which represents the "conversion" or "efficiency" factor associated with resonant cavity 60. The second stage ascertains the extent to which resonant cavity 60 alters the first stage's transmission path between transmitting antenna 20 and receiving antenna 30. In other words, the second stage ascertains the degree of efficiency of resonant cavity 60 as a blackbody, which is an idealized notion that by definition is characterized by emissivity $\epsilon = 1$. Accordingly, the calibration factor $C_2$ of resonant cavity 60 is equivalent to emissivity ∈ of resonant cavity 60.

According to usual inventive practice, the emissivity ∈ of resonant cavity 60 falls within the range of $0.95 \leq \epsilon < 1$. Otherwise expressed, resonant cavity 60 will usually have a blackbody efficiency of at least 95% but less than 100%, many having a blackbody efficiency of 96-97%. In the second stage, the power that is propagated from transmitting antenna 20 (connected to resonant cavity 60 at inlet port 26) is diminishing by its journey through resonant cavity 60 to receiving antenna 30 (connected to resonant cavity 60 at outlet port 36). The power level transmitted by transmitting antenna 30 thus translates into a reduced power level incident on resonant cavity 60's outlet port 36.

In the third stage, illustrated in FIG. 3, resonant cavity 60 is situated between transmitting antenna 20 and PMMW device 70. In the third stage, the energy source 10—transmitting antenna 20 unit remains attached to the inlet (input) port 26 of resonant cavity 60; however, receiving antenna 30 (which is known receiving antenna) is replaced with PMMW device 70 (which acts as a kind of receiving antenna, but an unknown one). Receiving antenna 30 is removed from resonant cavity 60's port 36, and PMMW device 70 is connected to resonant cavity 60's port 36. Thus, the oscilloscope 40—PMMW device 70 unit is attached to the outlet (output) port 36 of resonant cavity 60.

Similarly as performed in the second stage, in the third stage the entire system is operated until the steady state has been achieved. The voltage measurement on oscilloscope 40 per the third stage differs from the voltage measurement on oscilloscope 40 per the second stage; this deviation in the third-stage voltage measurement reflects the calibration factor $C_3$ of the PMMW device 70. The calibration factor $C_3$ of the PMMW device 70 can be adjusted until the third-stage voltage measurement value matches the second-stage voltage measurement value.

The present invention uniquely provides for power injection into a resonant cavity that is characterized by tortuous pathways and high electrical conductivity along the pathways so as to permit determination of the amount of power that is re-radiated. The tortuous pathways of resonant cavity 60 impart to resonant cavity 60 a character akin to that of a theoretical blackbody. Resonant cavity 60 is typically embodied as a tortuous-path cavity that is highly electrically conductive along all pathway surfaces inside resonant cavity 60. For instance, all pathway surfaces can be plated or coated with gold; not necessarily thick, the gold plating or gold coating can be relatively thin but sufficiently effective. Resonant cavity 60 is highly conductive and contains a sufficiently complex internal geometry to thoroughly "confuse" the signal path between transmitting antenna 20 and receiving antenna 30. The pathways of resonant cavity 60 are so complex that there is no possibility of tracing a path in resonant cavity 60 between its inlet port 26 and its outlet port 36.

A tortuous-path resonant cavity 60 is especially propitious for applications involving electromagnetic energy at millimeter wavelengths, as a tortuous-path resonant cavity 60 represents well the behavior of a blackbody radiator at millimeter wavelengths. Typical inventive embodiments obviate extremely high temperatures for the purpose of mimicking a theoretical blackbody, because the tortuous paths characterizing resonant cavity 60 should work particular well in association with some forms of radiation (e.g., MMW radiation) to achieve this purpose.

According to typical inventive practice, resonant cavity 60 is a complicated-path chamber characterized by an emissivity approaching (but less than) unity, i.e., the emissivity of a theoretical blackbody. Current technology does not permit a resonant cavity 60 to be made that is a perfectly conductive resonant chamber; at best, resonant cavity is in small part an absorbing chamber and in large part an emitting chamber. Depending on the inventive embodiment, resonant cavity 60 may have an emissivity ∈ as high as approximately 99%. The present invention's second-stage determination of calibration factor $C_2$, which gauges resonant cavity 60's re-radiative efficiency vis-à-vis a theoretical blackbody, is effectively a determination of resonant cavity 60's emissivity under second-stage conditions with respect to temperature, wavelength, etc. A theoretical blackbody absorbs all energy incident on it, and re-radiates all of the incident energy uniformly—in all directions, at all angles, and at all frequencies. Resonant cavity 60 thus constitutes a special kind of graybody, namely, a near-blackbody graybody.

As shown in FIG. 2 and FIG. 3, provided in resonant cavity 60 are a small inlet port 26, for energy to be introduced, and a small outlet port 36, for energy to "leak out." According to frequent inventive practice, a known, large amount of MMW energy is actively injected ("pumped") in through inlet port 26, located at one end of resonant cavity 60. A nearly uniform radiative distribution of MMW energy is reached inside and throughout resonant cavity 60. Resonant cavity 60's blackbody-like behavior, including its near-uniform MMW energy distribution, is attributable to resonant cavity 60's tortuous-path internal geometry. Since relatively little MMW energy is absorbed by resonant cavity 60, the amount of MMW energy exiting resonant cavity 60 is only slightly or moderately less that the MMW amount of energy that entered resonant cavity 60.

Some embodiments of the present invention perform the second stage in an approximative fashion in the sense of assuming theoretical blackbody behavior, including emissivity ∈ of one, for resonant cavity 60. Calibration factor $C_2$ is deemed equal to one, and the second-stage measurement of $P_{M2}$ is performed for use in a simplified version (wherein $C_2=1$) of the third-stage calibration of the electronic device 70.

The present invention can utilize practically any computer device 100 to input and/or calculate (and record and/or display) values such as generated power $P_T$, air-conveyed antenna-received power $P_T$, cavity-conveyed antenna-received power $P_{RC}$, first-stage power measurement $P_{M1}$, second-stage power measurement $P_{M2}$, third-stage power measurement $P_{M3}$, first calibration factor $C_1$, second calibration factor $C_2$, and third calibration factor $C_3$. The present invention can be practiced so as to implement computer 100 and power meter 40 as separate apparatus, or, alternatively, in a combined electronic unit that performs all of the present invention's functions, both metric and calculative.

Terms such as "computer," "computer device," and "computer system," as used herein in context of inventive practice, broadly refer to any machine or combination of machines having at least a processor and a memory, and perhaps also having capabilities such as display, printing, etc. An inventive computer program product can be resident in the memory of a computer. A typical inventive computer program product includes a computer-readable storage medium having computer-readable program code portions stored therein, the computer-readable program code portions including: a first executable code portion, for calculating first calibration factor $C_1$; a second executable code portion, for calculating second calibration factor $C_2$; a third executable code portion, for calculating third calibration factor $C_3$.

Figure 4:
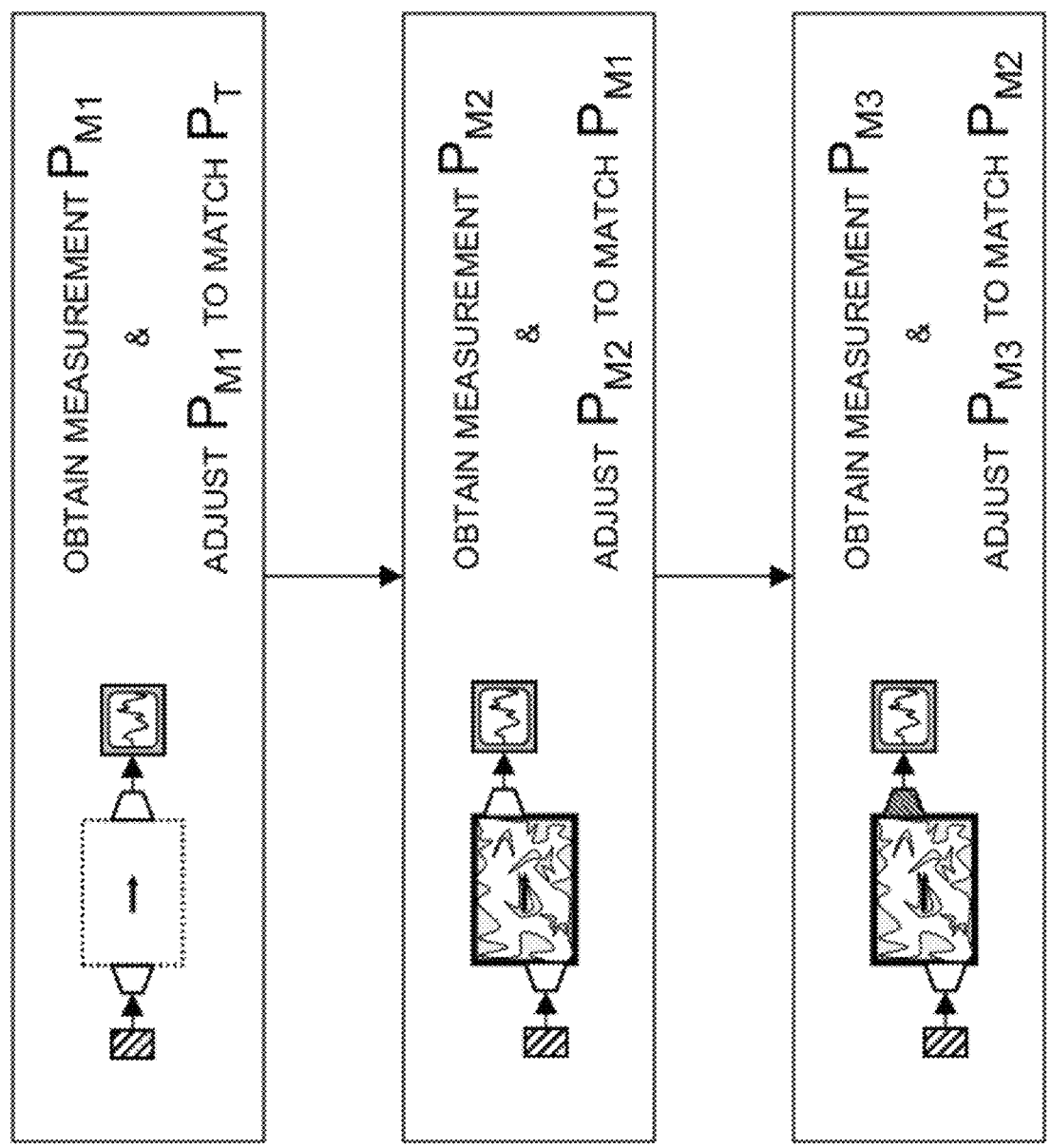
FIG. 4 is a flow diagram of the three stages of calibration in accordance with typical practice of the present invention's "adjustive" mode of practice.
Figure 5:
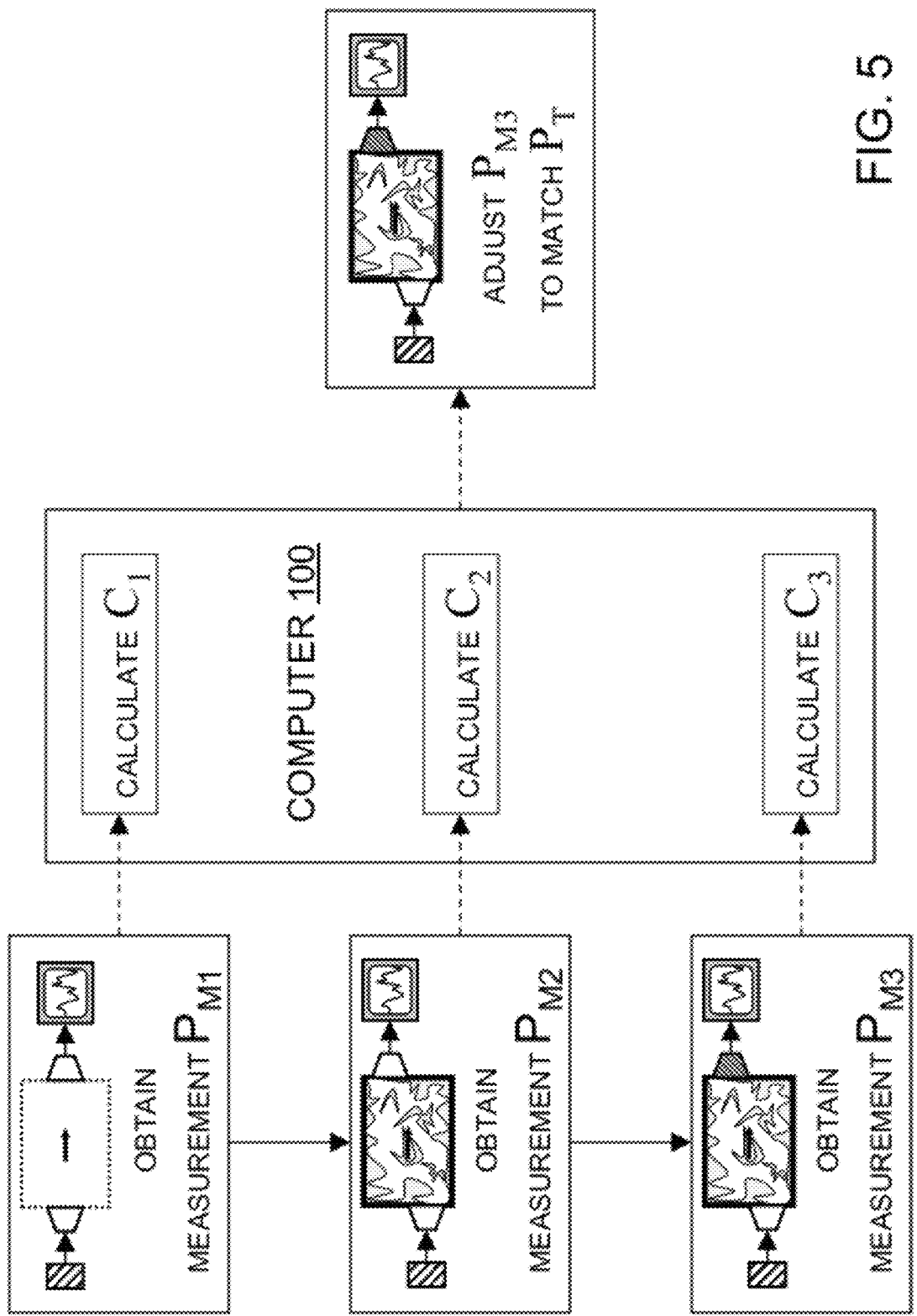
FIG. 5 is a flow diagram of the three stages of calibration in accordance with typical practice of the present invention's "calculative" mode of practice.

Reference is now made to FIG. 4 and FIG. 5, which respectively illustrate the "adjustive" and "calculative" modes of inventive practice. Inventive practice can be characterized either by repeated calibrative adjustments whereby each adjustment follows calculation of a calibration factor (exemplified by FIG. 4), or by final calibrative adjustment following calculations of all of the calibration factors (exemplified by FIG. 5). Some inventive embodiments can have indicia of both modes of inventive practice.

As shown by way of example in FIG. 4, the present invention's adjustive approach involves a series of adjustments in the present invention's electronic apparatus. Each adjustment of an electronic component is made at the conclusion of a given stage, and renders that stage's power measurement in comportment with a comparative power value that is previously known or measured. For instance, at the conclusion of the first stage, receiving antenna 30 can be adjusted for calibration factor $C_1$ so that $P_{M1}$ equals $P_T$. At the conclusion of the second stage, oscilloscope 40 can be adjusted for calibration factor $C_2$ so that that $P_{M2}$ equals $P_{M1}$. At the conclusion of the third stage, PMMW device 70 can be adjusted for calibration factor $C_3$ so that that $P_{M3}$ equals $P_{M2}$.

In contrast, as shown by way of example in FIG. 5, the present invention's calculative approach involves a series of power measurements and calibration-factor calculations. The calculative approach can be taken just to obtain calibration data (at least for the time being), or can additionally include physical calibration such as culminating in calibrative adjustment of PMMW device 70 following the third stage. PMMW device 70 can be adjusted as a single physical calibration that accounts for all three calibration factors, viz., $C_1$, $C_2$, and $C_3$.

The present invention, which is disclosed herein, is not to be limited by the embodiments described or illustrated herein, which are given by way of example and not of limitation. Other embodiments of the present invention will be apparent to those skilled in the art from a consideration of the instant disclosure or from practice of the present invention. Various omissions, modifications and changes to the principles disclosed herein may be made by one skilled in the art without departing from the true scope and spirit of the present invention, which is indicated by the following claims.

What is claimed is:

1. A calibration method comprising the steps of:
   (a) calibrating a receiving antenna, said calibrating of said receiving antenna including measuring a value of power transmitted through air and received by said receiving antenna, said power being characterized by an original said value prior to being transmitted through air and received by said receiving antenna, said calibrating of said receiving antenna further including adjusting the measured said value of said power transmitted through air and received by said receiving antenna to correspond to the original said value of said power;
   (b) calibrating a resonant cavity, said calibrating of said resonant cavity including measuring a said value of said power transmitted through said resonant cavity and received by said receiving antenna calibrated in accordance with step (a), said power being characterized by the original said value prior to being transmitted through said resonant cavity and received by said receiving antenna, said calibrating of said resonant cavity further including adjusting the measured said value of said power transmitted through said resonant cavity and received by said receiving antenna calibrated in accordance with step (a) to equal the measured said value, in accordance with step (a), of said power transmitted through air and received by said receiving antenna;
   (c) calibrating a device, said calibrating of said device including measuring a said value of said power transmitted through said resonant cavity calibrated in accordance with step (a) and received by said device, said power being characterized by the original said value prior to being transmitted through said resonant cavity and received by said device, said calibrating of said device further including adjusting the measured said value of said power transmitted through said resonant cavity calibrated in accordance with step (a) and received by said device to equal the measured said value, in accordance with step (b), of said power transmitted through said resonant cavity and received by said receiving antenna calibrated in accordance with step (a).

2. The calibration method of step 1 wherein the calibration of step (a) is performed with respect to a standard assuming free space transmission of said power when transmitted through air, and wherein the calibration of step (b) is performed with respect to a standard assuming idealized black body transmission of said power when transmitted through said resonant cavity.

3. The calibration method of step 1 wherein each said measurement of a said value of said power is performed using an apparatus selected from the group consisting of voltmeter, ammeter, wattmeter, and multimeter.

4. The calibration method of step 1 wherein each said measurement of a said value of said power includes measuring at least one of electrical power, electrical voltage, and electrical current.

5. The calibration method of step 1 wherein said power is associated with one of electromagnetic energy and acoustic energy.

6. A method for calibrating an electronic device, the method comprising:
   determining a first calibration factor, said determining of said first calibration factor including: generating power using an energy source; transmitting the generated said power using a transmitting antenna so that the generated, antenna-transmitted said power is conveyed through air; receiving the generated, antenna-transmitted, air-conveyed said power using a receiving antenna; measuring the amount of generated, antenna-transmitted, air-conveyed, antenna-received said power using an electricity meter; and comparing the amount of generated, antenna-transmitted, air-conveyed, antenna-received, measured said power to the amount of generated, antenna-transmitted said power;
   determining a second calibration factor, said determining of said second calibration factor including: introducing a resonant cavity between said transmitting antenna and said receiving antenna; generating the same said amount of generated said power using said energy source; transmitting the generated said power using said transmitting antenna so that the generated, antenna-transmitted said power is conveyed through said cavity; receiving the generated, transmitted, cavity-conveyed said power using said receiving antenna; measuring the amount of generated, antenna-transmitted, cavity-conveyed, antenna-received said power using said electricity meter; and comparing the amount of generated, antenna-transmitted, cavity-conveyed, antenna-received, measured said power to the amount of generated, antenna-transmitted said power;
   determining a third calibration factor, said determining of said third calibration factor including: replacing said receiver with an electronic device; generating the same said amount of generated said power using said energy source; transmitting the generated said power using said transmitting antenna so that the generated, antenna-transmitted said power is conveyed through said cavity; receiving the generated, transmitted, cavity-conveyed said power using said electronic device; measuring the amount of generated, antenna-transmitted, cavity-conveyed, device-received said power using said electricity meter; and comparing the amount of generated, antenna-transmitted, cavity-conveyed, device-received, measured said power to the amount of generated, antenna-transmitted said power.

7. The method for calibrating of claim 6 wherein the method further comprises, subsequent to performing steps (a), (b), and (c), the step of: (d) adjusting the amount of generated, antenna-transmitted, cavity-conveyed, device-received, measured said power to equal the amount of generated, antenna-transmitted said power.

8. The method for calibrating of claim 6, wherein said electricity meter is useable for measuring at least one of electrical voltage, electrical current, and electrical power.

9. The method for calibrating of claim 6, wherein said energy source generates radiant power or acoustic power, and wherein said electricity meter measures electrical voltage or electrical current or electrical power.

10. The method for calibrating of claim 6, wherein:
according to said determining of said first calibration factor, $P_T=P_R$, and $P_{M1}=C_1 P_R$;
according to said determining of said second calibration factor, $P_{RC}=C_2 P_T$, and $P_{M2}=C_1 P_{RC}=C_1 C_2 P_T$;
according to said determining of said third calibration factor, $P_{RC}=C_2 P_T$, $P_{M3}=C_3 P_{RC}=C_3 C_2 P_T$, and $C_3=P_{M3}/P_{RC}=P_{M3}/C_2 P_T$;
$P_T$ is the generated, antenna-transmitted said power;
$P_R$ is the generated, antenna-transmitted, air-conveyed, antenna-received said power;
$P_{RC}$ is either the generated, antenna-transmitted, cavity-conveyed, antenna-received said power, or the generated, antenna-transmitted, cavity-conveyed, device-received said power;
$P_{M1}$ is the generated, antenna-transmitted, air-conveyed, antenna-received, measured said power;
$P_{M2}$ is the generated, antenna-transmitted, cavity-conveyed, antenna-received, measured said power;
$P_{M3}$ is the generated, antenna-transmitted, cavity-conveyed, device-received, measured said power;
$C_1$ is said first calibration factor;
$C_2$ is said second calibration factor;
$C_3$ is said third calibration factor.

11. The method for calibrating of claim 6, wherein:
said first calibration factor is associated with the receiving by said receiving antenna of the generated, antenna-transmitted, air-conveyed said power;
said second calibration factor is associated with the conveyance through said cavity of the generated, antenna-transmitted said power;
said third calibration factor is associated with the receiving by said device of the generated, antenna-transmitted, cavity-conveyed said power.

12. The method for calibrating of claim 11, wherein:
according to said determining of said first calibration factor, $P_T=P_R$, and $P_{M1}=C_1 P_R$;
according to said determining of said second calibration factor, $P_{RC}=C_2 P_T$, and $P_{M2}=C_1 P_{RC}=C_1 C_2 P_T$;
according to said determining of said third calibration factor, $P_{RC}=C_2 P_T$, $P_{M3}=C_3 P_{RC}=C_3 C_2 P_T$, and $C_3=P_{M3}/P_{RC}=P_{M3}/C_2 P_T$;
$P_T$ is the generated, antenna-transmitted said power;
$P_R$ is the generated, antenna-transmitted, air-conveyed, antenna-received said power;
$P_{RC}$ is either the generated, antenna-transmitted, cavity-conveyed, antenna-received said power, or the generated, antenna-transmitted, cavity-conveyed, device-received said power;
$P_{M1}$ is the generated, antenna-transmitted, air-conveyed, antenna-received, measured said power;
$P_{M2}$ is the generated, antenna-transmitted, cavity-conveyed, antenna-received, measured said power;
$P_{M3}$ is the generated, antenna-transmitted, cavity-conveyed, device-received, measured said power;
$C_1$ is said first calibration factor;
$C_2$ is said second calibration factor;
$C_3$ is said third calibration factor.

13. The method for calibrating of claim 12 wherein the method further comprises, subsequent to performing steps (a), (b), and (c), the step of: (d) adjusting $P_{M3}$ to equal $P_T$.

14. The method for calibrating of claim 12, wherein $P_T$, $P_R$, and $P_{RC}$ each represent radiant power or acoustic power that is generated by said energy source.

15. The method for calibrating of claim 14, wherein $P_{M1}$, $P_{M2}$, and $P_{M3}$ each represent electrical voltage, or electrical current, or electrical power that is measured by said electricity meter.

16. The method for calibrating of claim 15, wherein $P_T$, $P_R$, and $P_{RC}$ each represent radiant power or acoustic power that is generated by said energy source.

* * * * *